(12) United States Patent
Takatsu

(10) Patent No.: US 6,356,220 B1
(45) Date of Patent: Mar. 12, 2002

(54) A/D CONVERTING DEVICE, A/D CONVERTING METHOD AND OPTICAL PULSE TESTING APPARATUS

(75) Inventor: Tatsuhiko Takatsu, Tokyo (JP)

(73) Assignee: Ando Electric Co., LTD, Tokyo (JP)

( * ) Notice: Subject to any disclaimer, the term of this patent is extended or adjusted under 35 U.S.C. 154(b) by 0 days.

(21) Appl. No.: 09/406,708

(22) Filed: Sep. 28, 1999

(30) Foreign Application Priority Data

Sep. 28, 1998 (JP) .......................................... 10-273694

(51) Int. Cl.[7] ................................................ H03M 1/00
(52) U.S. Cl. ...................................... 341/137; 341/159
(58) Field of Search ................................ 341/155, 141, 341/159, 161, 137

(56) References Cited

U.S. PATENT DOCUMENTS 5,574,754 A * 11/1996 Kurihara et al. ............. 375/367
5,745,468 A * 4/1998 Nakano ....................... 369/124
5,825,318 A * 10/1998 Patapoutian et al. ........ 341/131

* cited by examiner

Primary Examiner—Peguy Jeanpierre
(74) Attorney, Agent, or Firm—Oliff & Berridge, PLC

(57) ABSTRACT

An A/D converting device comprises; a plurality of A/D converters connected in parallel with each other, for carrying out a converting operation a plurality of numbers of times, in which an analog signal is converted into a digital data, a selecting circuit for selecting each A/D converter from the plurality of A/D converters at each sampling timing during the converting operation to sample the converted digital data, a selecting circuit controlling unit for controlling the selecting circuit so that when one A/D converter is selected at one sampling timing during the Nth converting operation, another A/D converter is selected at the one sampling timing during the (N+1)th converting operation, an adding circuit for integrating the digital data sampled at the one sampling timing during each converting operation, and a processing unit for processing the integrated digital data.

12 Claims, 9 Drawing Sheets

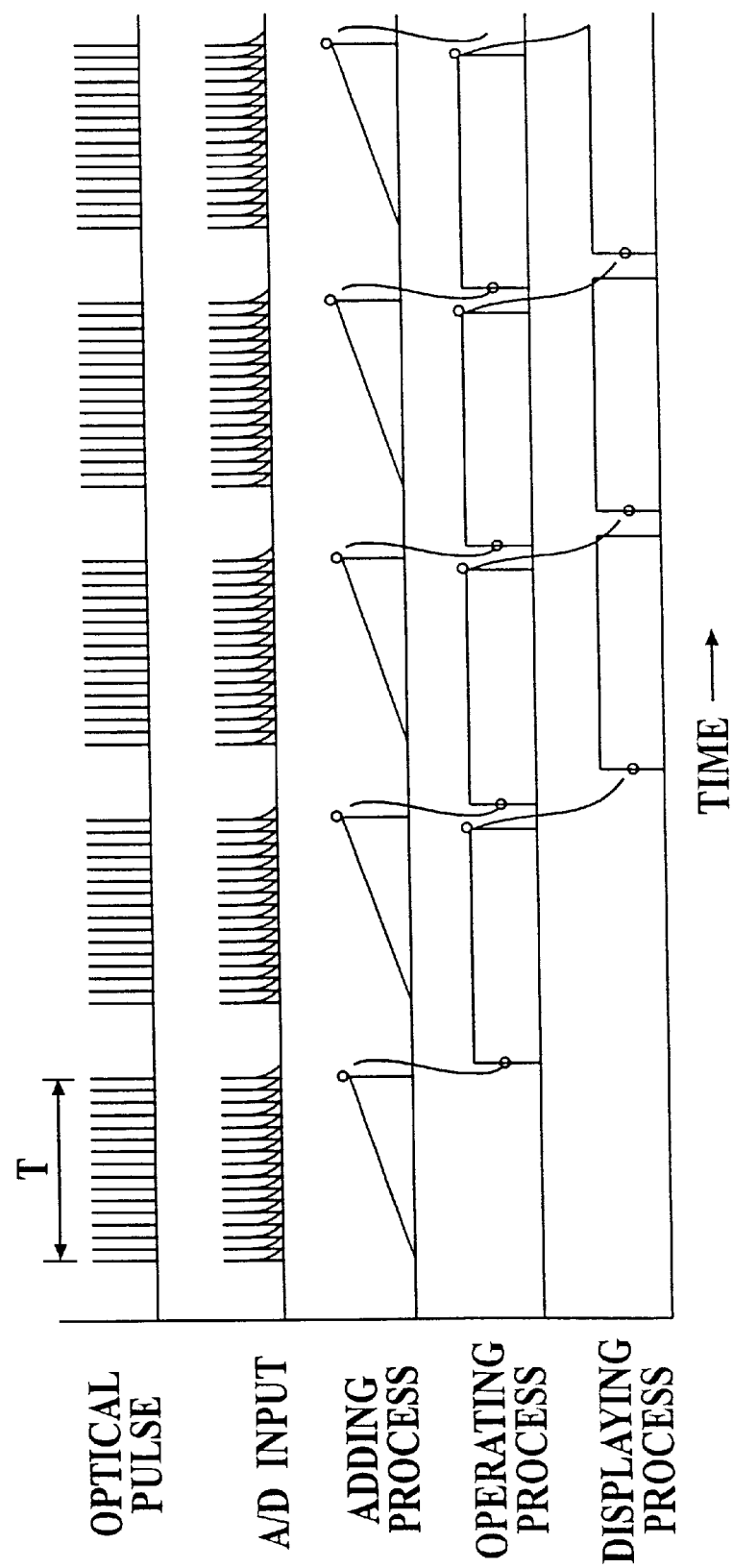

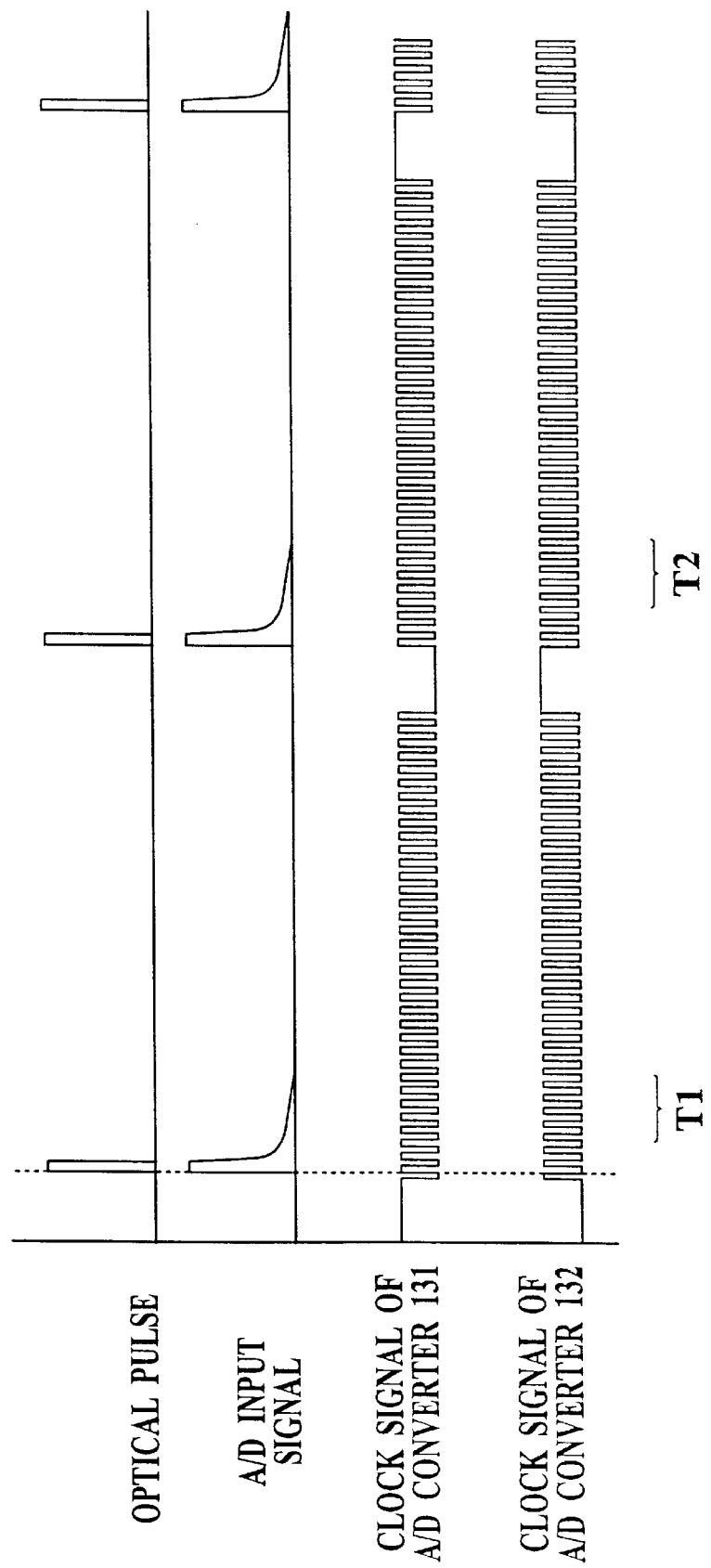

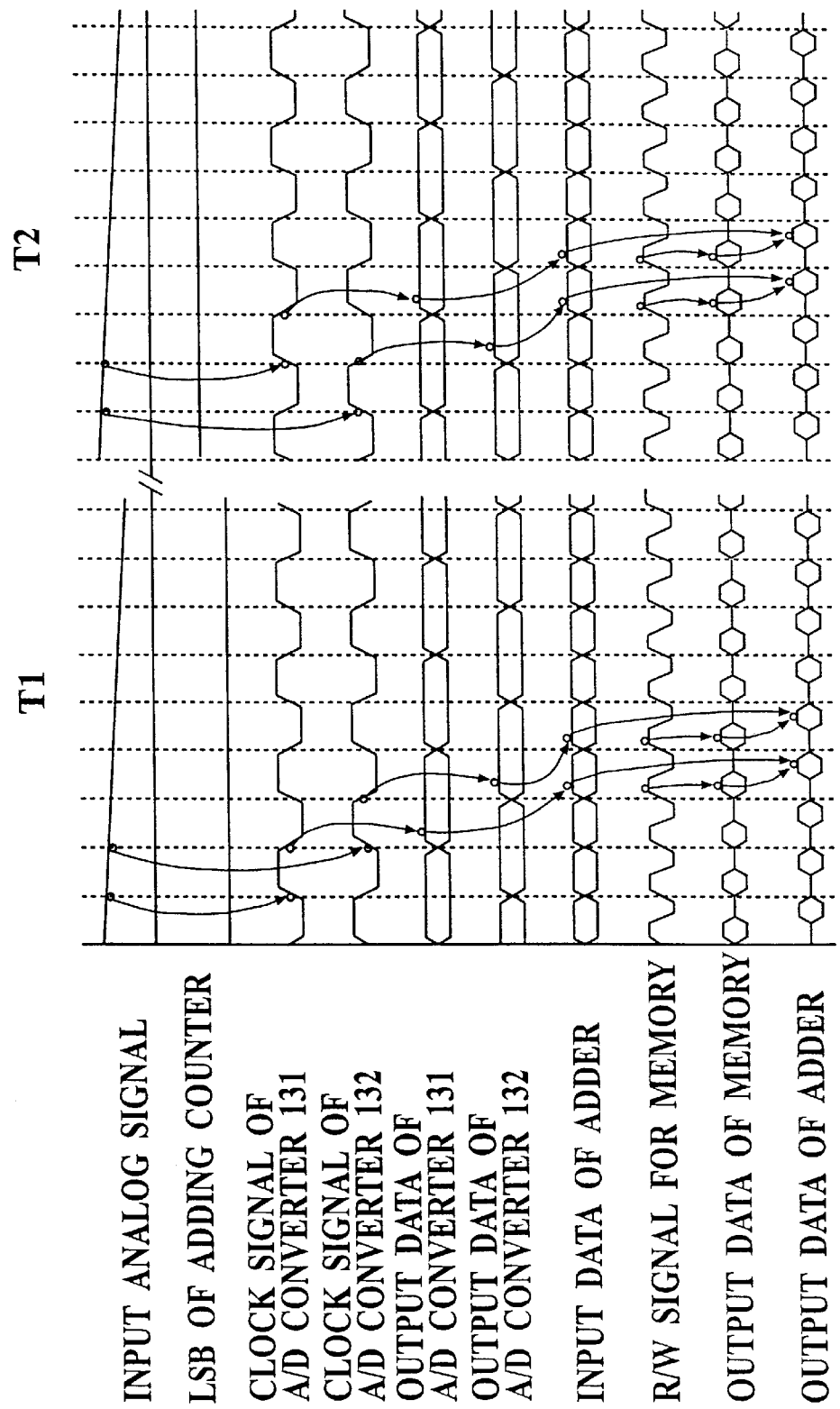

A/D CONVERTING DEVICE, A/D CONVERTING METHOD AND OPTICAL PULSE TESTING APPARATUS

BACKGROUND OF THE INVENTION

1. Field of the Invention

The present invention relates to an A/D converting device, an A/D converting method and an optical pulse testing apparatus, which are suitable for an optical test.

2. Description of the Related Art

The OTDR (Optical Time Domain Reflectometry) method for detecting a breaking point of an optical cable and for measuring a loss or the like, which is caused by a connecting point thereof has been developed. In the OTDR method, the breaking point of the optical cable is detected and the loss or the like, which is caused by the connecting point of the optical cable is measured by measuring a pulse height of a light returned back to the incident end of the optical cable.

An optical pulse testing apparatus using the OTDR method has been used. The optical pulse testing apparatus comprises a pulse generator, a connector, a fiber to be measured, a coupler, an optical fiber, an APD (Avalanche Photo Diode), an OP-amp (operational amplifier), an A/D (Analog to Digital) converter, a signal processing part or the like.

In the optical pulse testing apparatus, the optical pulse is generated by the pulse generator to transmit it to the coupler. The optical pulse passes through the coupler to transmit it to the optical fiber. While the optical pulse transmitted to the optical fiber from the coupler passes through the optical fiber, (that is, in proportion to the length of the optical fiber from the incident end thereof,) the loss which the optical fiber has causes the power of the optical pulse to be damped.

Because backward scattering lights are caused by the characteristics of the optical fiber at each point of the optical fiber, the backward scattering lights are transmitted to the APD through the coupler and the optical fiber. The backward scattering lights passing through the optical fiber and received by the APD are converted into electric current waveform signals corresponding to the intensities of the received lights by the APD to output them to the OP-amp. The electric current waveform signals outputted from the APD are amplified by a predetermined gain with the OP-amp and are converted into the voltage waveform signals. Then, the voltage waveform signals are converted into digital signals having a predetermined number of bits, which are sampled by a predetermined sampling frequency with the A/D converter, to output the digital signals to the CPU circuit in the signal processing unit. In the CPU circuit, the level of the backward scattering light is identified on the basis of the digital signal outputted from the A/D converter to display the waveform of the backward scattering light received by the APD or that of the Fresnel reflection light received by the APD on the display.

In the A/D converter used in the optical pulse testing apparatus, because the frequency band width of the voltage waveform signal inputted into the A/D converter is several hundreds MHz, in order to convert the inputted voltage waveform signal into the digital signal having a low distortion by a predetermined resolution (number of bits), the sampling frequency having not less than several hundreds MHz and the resolution enabling the change of the voltage to be detected more particularly are required.

When it is attempted that these requirements are satisfied by using one A/D converter, the cost of the one A/D converter is higher than that of the A/D converter for covering several tens MHz band, which is used in signal processing systems, such as broadcasting media or the like. For this reason, according to an earlier development, when the A/D converter for covering several tens MHz band is used, the following method is applied. Each sampling timing is changed in each sweeping operation in order to reconfigure the bit data obtained by carrying out the sweeping operations a plurality of times. Thereby, the same digital data having a desirable resolution can be obtained as the data to be obtained by using the expensive A/D converter in one sweeping operation. As a result, the A/D converter for covering several hundreds MHz band can be realized by a low cost.

However, it is necessary that the sweeping operations are carried out a plurality of times to obtain the desirable resolution by using the above method. It is thought that the following method is carried out. A plurality of A/D converters are assigned to each sampling timing. As a result, the digital signal having a desirable resolution can be obtained by carrying out only one sweeping operation.

In the earlier optical pulse testing apparatus, when the method in which a plurality of A/D converters are used is carried out, the following problems are caused.

FIG. 7A shows an output characteristic of an A/D converter 21. FIG. 7B shows an output characteristic of an A/D converter 22. When the A/D converters 21 and 22 convert the same analog signal into a digital signal, the output level of the digital signal into which the analog signal is converted by the A/D converter 21 is different from that of the digital signal into which the analog signal is converted by the A/D converter 22 in the vicinity of the reference level shown by the dashed line, as shown in FIGS. 7A and 7B. FIG. 8 shows a circuit construction of an A/D converting unit using the A/D converters 21 and 22 in the optical pulse testing apparatus.

In FIG. 8, each digital signal outputted from the A/D converters 21 and 22 is outputted to a CPU circuit 24 through a switch 23. The switch 23 is controlled by a switching signal outputted from the CPU circuit 24 so that the digital signal outputted from the A/D converter 21 and the digital signal outputted from the A/D converter 22 are outputted to the CPU circuit 24 alternately.

In case that the digital signal outputted from the A/D converter 21 is outputted to the CPU circuit 24 through the switch 23 at the first sampling timing T1, the digital signal outputted from the A/D converter 22 is outputted to the CPU circuit 24 through the switch 23 at the next sampling timing T2.

In the A/D converting unit, when the voltage waveform signal of which the level is reduced with the lapse of time as shown in FIG. 9A is inputted into the A/D converters 21 and 22, there is a problem that the digital signal into which the voltage waveform signal is converted has noises which do not correspond to the reduction of the input level of the voltage waveform signal.

Because of the difference between the output characteristic of the A/D converter 21 and that of the A/D converter 22, which are shown in FIGS. 7A and 7B, even though the input level of the voltage waveform signal inputted into the A/D converter 21 is the same as that of the A/D converter 22, the output level of the digital signal outputted from the A/D converter 21 is different from that of the A/D converter 22. As a result, when the two digital signals into which the voltage waveform signal is converted by the A/D converters 21 and 22 are outputted alternately, the output level is not constant in the vicinity of the reference level as shown in FIG. 9B.

In case of using a plurality of A/D converters, because of quantization errors caused by an irregularity of a gain of the A/D converter and that of linearity of the converted digital signal, the output value of the digital signal into which the A/D converter 21 converts the analog signal is not coincident with that of the A/D converter 22, even though the analog signal inputted into the A/D converter 21 is the same as that of the A/D converter 22. The problem that the waveform measurement value is not constant in each sampling when the two A/D converters 21 and 22 are used is caused by the above non-coincidence of the output values. In particular, when the data to be analyzed by a bit resolution which is much higher than that of the A/D converter is processed by using an A/D convert with dither method like an optical pulse testing apparatus, the above non-coincidence of the measurement values causes serious problems.

SUMMARY OF THE INVENTION

In order to solve the above-described problems, an object of the present invention is to provide an A/D converting device, an A/D converting method and an optical pulse testing apparatus, which carry out the control to switch one digital signal outputted from one A/D converter to another properly so that the dispersion of output characteristic of each A/D converter can be cancelled while a plurality of A/D converters are used.

That is, in accordance with one aspect of the present invention, the A/D converting device for converting an input signal having a cyclic waveform into a digital data by using a plurality of A/D converters connected in parallel with each other, comprises;

a selecting circuit for selecting each digital data from those of the plurality of A/D converters in an order, and an output order changing circuit for changing the order in which each digital data is selected from those of the plurality of A/D converters by the selecting circuit.

According to the present invention, when digital data is obtained at one sampling point, digital data outputs of a plurality of A/D converters are synthesized. In case that the digital data outputted from a plurality of A/D converters are synthesized, the digital data output having fewer errors can be obtained according to the central limit theorem, as compared with the case in which one A/D converter is used.

The selecting circuit may select each digital data to be outputted from each A/D converter from those of the plurality of A/D converters in the order by synchronizing with a sampling timing of the each A/D converter, and the output order changing circuit may change the order by synchronizing with the sampling timing of the each A/D converter when each digital data is selected from those of the plurality of A/D converters by the selecting circuit.

In case that the digital data outputted from a plurality of A/D converters at each sampling point of the time series cyclic signal are synthesized, the cyclic noise having a repeated pattern, which is caused at the sampling timing of each A/D converter by assigning each A/D converter to each sampling point of the time series cyclic signal, can be removed.

In accordance with another aspect of the present invention, the A/D converting method for converting an input signal having a cyclic waveform into a digital data by using a plurality of A/D converters connected in parallel with each other, comprises the steps of;

selecting each digital data from those of the plurality of A/D converters in an order, and changing the order in which each digital data is selected from those of the plurality of A/D converters by carrying out the selecting step.

According to the present invention, when digital data is obtained at one sampling point, digital data outputs of a plurality of A/D converters are synthesized. In case that the digital data outputted from a plurality of A/D converters are synthesized, the digital data output having fewer errors can be obtained according to the central limit theorem, as compared with the case in which one A/D converter is used.

The selecting step may be carried out by selecting each digital data to be outputted from each A/D converter from those of the plurality of A/D converters in the order by synchronizing with a sampling timing of the each A/D converter, and the changing step may be carried out by changing the order by synchronizing with the sampling timing of the each A/D converter when each digital data is selected from those of the plurality of A/D converters by carrying out the selecting step.

In case that the digital data outputted from a plurality of A/D converters at each sampling point of the time series cyclic signal are synthesized, the cyclic noise having a repeated pattern, which is caused at the sampling timing of each A/D converter by assigning each A/D converter to each sampling point of the time series cyclic signal, can be removed.

In accordance with another aspect of the present invention, the optical pulse testing apparatus for converting an optical signal into a digital data by using a plurality of A/D converters connected in parallel with each other to output an integrated value of each digital data outputted from each A/D converter as a measuring result, comprises;

a selecting circuit for selecting each digital data from those of the plurality of A/D converters in an order, and an output order changing circuit for changing the order in which each digital data is selected from those of the plurality of A/D converters by the selecting circuit.

According to the present invention, when digital data is obtained at one sampling point, digital data outputs of a plurality of A/D converters are synthesized. In case that the digital data outputted from a plurality of A/D converters are synthesized, the digital data output having fewer errors can be obtained according to the central limit theorem, as compared with the case in which one A/D converter is used.

The selecting circuit may select each digital data to be outputted from each A/D converter from those of the plurality of A/D converters in the order by synchronizing with a sampling timing of the each A/D converter, and the output order changing circuit may change the order by synchronizing with the sampling timing of the each A/D converter when each digital data is selected from those of the plurality of A/D converters by the selecting circuit.

In case that the digital data outputted from a plurality of A/D converters at each sampling point of the time series cyclic signal are synthesized, the cyclic noise having a repeated pattern, which is caused at the sampling timing of each A/D converter by assigning each A/D converter to each sampling point of the time series cyclic signal, can be removed.

In accordance with another aspect of the present invention, the A/D converting device comprises;

a plurality of A/D converters connected in parallel with each other, for carrying out a converting operation a plurality of numbers of times, in which an analog signal is converted into a digital data, a selecting circuit for selecting each A/D converter from the plurality of A/D converters at each sampling timing during the converting operation to sample the converted digital data, a selecting circuit controlling unit for controlling the selecting circuit so that when one A/D converter is selected at one sampling timing during the Nth converting operation, another A/D converter is selected at the one sampling timing during the (N+1)th converting operation, an adding circuit for integrating the digital data sampled at the one sampling timing during each converting operation, and a processing unit for processing the integrated digital data.

In accordance with another aspect of the present invention, the A/D converting method comprises the steps of;

carrying out a converting operation a plurality of numbers of times, in which an analog signal is converted into a digital data by using a plurality of A/D converters connected in parallel with each other, selecting each A/D converter from the plurality of A/D converters at each sampling timing during the converting operation to sample the converted digital data, selecting one A/D converter at one sampling timing during the Nth converting operation when another A/D converter was selected at the one sampling timing during the (N−1)th converting operation, integrating the digital data sampled at the one sampling timing during each converting operation, and processing the integrated digital data.

In accordance with another aspect of the present invention, the optical pulse testing apparatus comprises;

a plurality of A/D converters connected in parallel with each other, for carrying out a converting operation a plurality of numbers of times, in which an optical pulse is converted into a digital data, a selecting circuit for selecting each A/D converter from the plurality of A/D converters at each sampling timing during the converting operation to sample the converted digital data, a selecting circuit controlling unit for controlling the selecting circuit so that when one A/D converter is selected at one sampling timing during the Nth converting operation, another A/D converter is selected at the one sampling timing during the (N+1)th converting operation, an adding circuit for integrating the digital data sampled at the one sampling timing during each converting operation, and a processing unit for processing the integrated digital data.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein;

FIG. 3 is a timing chart for explaining a whole operation of the optical pulse testing apparatus shown in FIG. 1;

FIG. 4 is a timing chart for explaining an operation of the A/D converting unit shown in FIG. 2;

FIG. 5 is a timing chart for explaining each operation of the A/D converting unit and the adding unit 14 which are shown in FIG. 2 during the periods T1 and T2 shown in FIG. 4;

PREFERRED EMBODIMENT OF THE INVENTION

Hereinafter, an embodiment of the present invention will be explained in detail with reference to FIGS. 1 to 6.

FIGS. 1 to 6 show an embodiment of the optical pulse testing apparatus according to the present invention.

First, the construction of the optical pulse testing apparatus will be explained.

Figure 1:
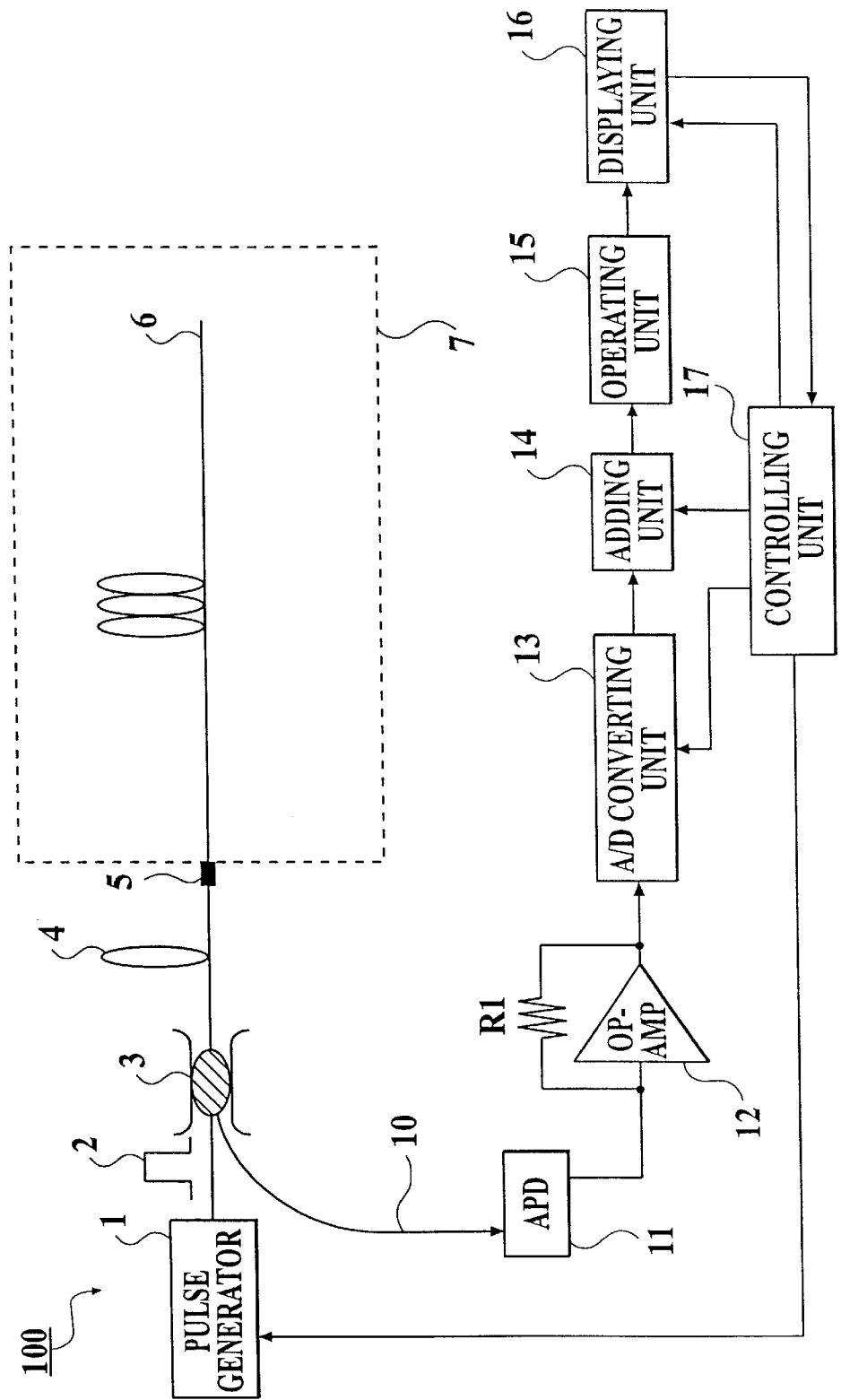
FIG. 1 is a view showing a principal construction of the optical pulse testing apparatus as an embodiment according to the present invention.

FIG. 1 shows a principal construction of the optical pulse testing apparatus 100.

In FIG. 1, the optical pulse testing apparatus 100 comprises a pulse generator 1, a coupler 3, an optical fiber 4, a connector 5, a fiber 7 to be measured, an optical fiber 10, an APD (Avalanche Photo Diode) 11, an OP-amp 12, an A/D (Analog to Digital) converting unit 13, an adding unit 14, an operating unit 15, a displaying unit 16, a controlling unit 17 or the like.

The pulse generator 1 generates an optical pulse 2 according to a pulse generation controlling signal outputted from the controlling unit 17 to transmit the optical pulse 2 to the coupler 3.

The coupler 3 passes the optical pulse 2 outputted from the pulse generator 1 to transmit it to the optical fiber 4. When a Fresnel reflection light is generated by the connector 5 which is a termination of the optical fiber 4 and by the far-end 6 of the fiber 7 to be measured, and is received by the coupler 3 through the optical fiber 4, or when backward scattering lights are generated at each point of the optical fiber 4 and at each point of the fiber 7 to be measured, and are received by the coupler 3 through the optical fiber 4, the coupler 3 passes the Fresnel reflection light or the backward scattering lights to transmit them to the APD 11 through the optical fiber 10.

The optical fiber 4 connects the coupler 3 with the connector 5. The optical fiber 4 passes the optical pulse 2 outputted from the coupler 3 to transmit the optical pulse 2 to the connector 5. When a Fresnel reflection light is generated by the connector 5 which is a termination of the optical fiber 4 and by the far-end 6 of the fiber 7 to be measured, and is received by the optical fiber 4, or when backward scattering lights are generated at each point of the optical fiber 4 and at each point of the fiber 7 to be measured, and is received by the optical fiber 4, the optical fiber 4 transmits the Fresnel reflection light or the backward scattering lights to the coupler 3.

The optical fiber 10 connects the coupler 3 with the APD 11. When a Fresnel reflection light is generated by the far-end 6 of the fiber 7 to be measured, and is received by the coupler 3 through the connector 5 and the optical fiber 4, or when backward scattering lights are generated at each point of the optical fiber 4 and at each point of the fiber 7 to be measured, and is received by the coupler 3 through the optical fiber 4, the optical fiber 10 transmits the Fresnel reflection light or the backward scattering lights to the APD 11.

The connector 5 generates the Fresnel reflection light by reflecting a part of the optical pulse 2 outputted from the optical fiber 4. The connector 5 passes the rest of the optical pulse 2 to input it into the fiber 7 to be measured.

The fiber 7 to be measured is an optical fiber to be measured. The detection of the breaking point of the fiber 7 to be measured, the measurement of the loss caused by the connecting point and the like are carried out for the fiber 7 to be measured. The light passing through the fiber 7 to be measured is reflected on the far-end 6 of the fiber 7 to be measured. As a result, the Fresnel reflection light is generated. Because the optical fibers 4 and 10 are simple optical fibers for connecting one unit with another, the fiber 7 to be measured is differentiated from the optical fibers 4 and 10.

The APD 11 is a light receiving element which converts an incident light into an electric current in proportion to an intensity of the incident light. When the Fresnel reflection light is generated by the connector 5 which is a termination of the optical fiber 4 and by the far-end 6 of the fiber 7 to be measured, and is received by the APD 11 through the optical fiber 4, the coupler 3 and the optical fiber 10, or when the backward scattering lights are generated at each point of the optical fiber 4 and at each point of the fiber 7 to be measured, and is received by the APD 11 through the optical fiber 4, the coupler 3 and the optical fiber 10, the APD 11 converts the Fresnel reflection light or the backward scattering lights into the electric current waveform signals in proportion to the intensity of the Fresnel reflection light and those of the backward scattering lights to output the electric current waveform signals to the OP-amp 12.

The OP-amp 12 and a resistance element R1 connected with the OP-amp 12 constitute a current-voltage converting circuit. The OP-amp 12 amplifies the slight electric current waveform signals outputted from the APD 11. The electric current waveform signals is converted into the voltage by a predetermined conversion rate which is set by the resistance element R1. The converted waveform signal is outputted to the A/D converting unit 13.

Figure 2:
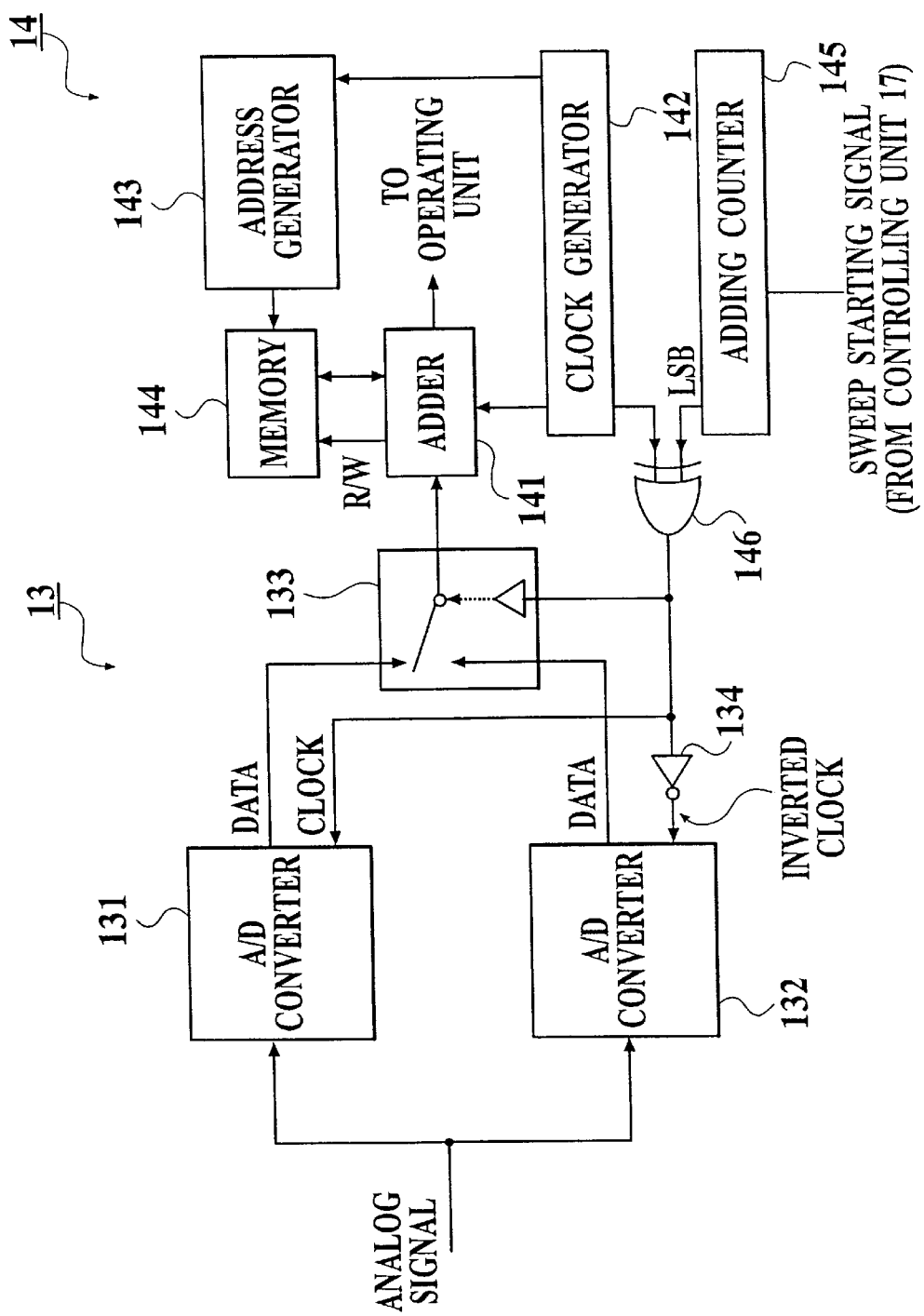
FIG. 2 is a view showing a detail circuit construction of the A/D converting unit and the adding unit which are shown in FIG. 1.

The A/D converting unit 13 comprises two A/D converters 131 and 132 which are connected in parallel with each other, a switch 133 and an inverter 134 as shown in FIG. 2.

The A/D converters 131 and 132 carry out the sampling of the voltage waveform signal (an analog signal input) outputted from the OP-amp 12 at the same sampling rate (for example, 50 MHz). The A/D converters 131 and 132 convert the voltage waveform signal into the digital data by a predetermined bit resolution (for example, 8 bits) in one clock cycle to output the digital data to the adding unit 14. In the present embodiment, the resolution in which the sampling of the signal is carried out at the sampling rate of 25 MHz and 12 bits data is sampled in one clock cycle is realized by integrating (adding) each output data of the two A/D converters 131 and 132 with the adding unit 14.

The A/D converter 131 carries out the sampling of the voltage waveform signal outputted from the OP-amp 12 at the sampling timing (50 MHz) on the basis of the clock signal outputted from the EXOR circuit 146 of the adding unit 14. The A/D converter 131 converts the voltage waveform signal into the 8 bits digital data to output the digital data to the switch 133.

The A/D converter 132 carries out the sampling of the voltage waveform signal outputted from the OP-amp 12 at the sampling timing (50 MHz) on the basis of the inverted clock signal outputted from the EXOR circuit 146 of the adding unit 14 through the inverter 134. The A/D converter 132 converts the voltage waveform signal into the 8 bits digital data to output the digital data to the switch 133.

The switch 133 is switched by the timing of the clock signal (that is, by synchronizing with the rise of the clock signal or the fall thereof) outputted from the EXOR circuit 146 of the adding unit 14. The switch 133 selects one digital data between the digital data outputted from the A/D converter 131 and that of the A/D converter 132 to output the selected digital data to an adder 141 of the adding unit 14.

In the A/D converting unit 13, in case that the digital converting process of the A/D converter 131 is carried out by synchronizing with the ON timing of the clock signal (that is, the rise of the clock signal) generated by the adding unit 14, the digital converting process of the A/D converter 132 is carried out by synchronizing with the OFF timing of the clock signal (that is, the fall of the clock signal) generated by the adding unit 14 because the clock signal is inverted.

The adding unit 14 comprises an adder 141, a clock generator 142, an address generator 143, a memory 144, an adding counter 145 and an EXOR circuit 146.

The adder 141 adds a time series digital data into which the voltage waveform signal is converted by the A/D converters 131 and 132 and which is alternately outputted from the A/D converters 131 and 132 through the switch 133 of the A/D converting unit 13 at the timing of the reference clock signal (that is, by synchronizing with the rise of the reference clock signal and the fall thereof) outputted from the clock generator 142, to an integrated value (a summation) of the time series digital data outputted from the memory 144, which is integrated (summed up) until the previous sweeping operations were carried out. The integrated value is written in the same address of the memory 144 as previously.

That is, when the converting operation, in which the voltage waveform signal is converted into the digital data is carried by the A/D converting unit 13 a plurality of numbers of times, the adder 141 integrates the digital data outputted from the A/D converting unit 13 at the same timing during each converting operation.

The clock generator 142 generates a reference clock signal to set the timing of the integrating operation (the summing up operation) in the adding unit 14. The clock generator 142 outputs the reference clock signal to the adder 141, the address generator 143 and the EXOR circuit 146.

The address generator 143 generates a write-in address for the digital data to be written in the memory 144 from the adder 141 at the timing of the reference clock signal outputted from the clock generator 142 to output the write-in address to the memory 144. The address generator 143 generates a read-out address for reading out the digital data by the adder 141 from the memory 144 to output the read-out address to the memory 144. The adding counter 145 inputs the sweep starting signal outputted from the controlling unit 17 there into to count up the number of times the time series digital data to be written in the memory 144 have been integrated (summed up).

The memory 144 writes the digital data outputted from the adder 141 in the write-in address assigned by the address generator 143. When the digital data is required to be read out by the adder 141, the memory 144 reads out the digital data from the read-out address assigned by the address generator 143 to output the digital data to the adder 141.

The adding counter 145 inputs the sweep starting signal outputted from the controlling unit 17 therein to count up the number of times the time series digital data to be written in the memory 144 have been to integrated. The adding counter 145 counts up the number of times the digital data have been integrated in one measurement. Until the count number counted up by the adding counter 145 reaches the predetermined number of times to integrate the digital data in the first measurement, the adding counter 145 causes an LSB (Least Significant Bit) signal of the adding counter 145 to be ineffective in order to output the LSB signal to the EXOR circuit 146. Until the count number counted up by the adding counter 145 reaches the predetermined number of times to integrate the digital data in the second measurement, the adding counter 145 causes the LSB signal of the adding counter 145 to be effective in order to output the LSB signal to the EXOR circuit 146. That is, the adding counter 145 causes the LSB signal to be ineffective during the measurement which is carried out the odd number of times. The adding counter 145 causes the LSB signal to be effective during the measurement which is carried out the even number of times. Thereby, the clock signal generated by the EXOR circuit 146 during the measurement which is carried out the odd number of times is inverted during the measurement which is carried out the even number of times.

The EXOR circuit 146 generates an exclusive OR as a clock signal between the reference clock signal outputted from the clock generator 142 and the LSB signal outputted from the adding counter 145. The EXOR circuit 146 outputs the generated clock signal to the A/D converters 131 and 132 and the switch 133 in the A/D converting unit 13 to control the timing of the operation of each circuit in the A/D converting unit 13.

When the LSB signal outputted from the adding counter 145 is ineffective, the EXOR circuit 146 generates the clock signal corresponding to the reference clock signal outputted from the clock generator 142. When the LSB signal outputted from the adding counter 145 is effective, the EXOR circuit 146 generates the clock signal by inverting the reference clock signal outputted from the clock generator 142. As a result, when the A/D converter 131 is selected at one sampling timing during the first converting operation, the adding counter 145 controls the switch 133 during the second converting operation so that the A/D converter 132 is selected at the same one sampling timing as the first converting operation.

In FIG. 1, the operating unit 15 carries out a filter process of the integrated data outputted from the adding unit 14 (for example, to obtain the moving average of the integrated data) and a logarithmic transformation thereof to output the processed data to the displaying unit 16.

The displaying unit 16 comprises a display, an operating panel and a CPU. The displaying unit 16 outputs an operating signal corresponding to the button operation of the user on the operating panel to the controlling unit 17 to command the start of the measurement, the finish thereof or the like. When the measurement is finished, the displaying unit 16 receives the data obtained by the logarithmic transformation, which is outputted from the operating unit 15, in order to display the data in the display. In the displaying unit 16, the CPU identifies the level of the backward scattering light and that of the Fresnel reflection light on the basis of the digital data obtained by the logarithmic transformation. The CPU forwards the displaying signal to the display to display the waveform of the backward scattering light received by the APD 11 and that of the Fresnel reflection light which is received by the APD The controlling unit 17 controls the operation of the pulse generator 1, that of the A/D converting unit 13, that of the adding unit 14 and that of the displaying unit 16 in the optical pulse testing apparatus 100. The controlling unit 17 controls whole measuring operation. The controlling unit 17 generates the controlling signals for operating each unit according to the command signal outputted from the displaying unit 16 in order to output them to each unit.

Next, the operations of the embodiment according to the present invention will be explained.

The whole operation of the optical pulse testing apparatus 100 shown in FIG. 1 will be explained with reference to the timing chart shown in FIG. 3.

FIG. 3 shows the optical pulse 2 which is generated by the pulse generator 1, the measured voltage waveform signal (A/D input) which is inputted into the A/D converting unit 13, the adding process which is carried out by the adding unit 14, the operating process which is carried out by the operating unit 15 and the displaying process which is carried out by the displaying unit 16.

In the optical pulse testing apparatus 100 shown in FIG. 1, when the measuring process of the optical pulse is carried out, the optical pulse 2 is generated repeatedly for a short time during one measurement period T, as shown in FIG. 3. Each optical pulse 2 is transmitted to the APD 11 as a backward scattering light through the optical fiber 4, the coupler 3 and the optical fiber 10. In the APD 11, the backward scattering lights are successively converted into electric current waveform signals corresponding to each intensity of the backward scattering light to output them to the OP-amp 12. In the OP-amp 12, the electric current waveform signals which are successively outputted from the APD 11 are amplified by a predetermined gain to successively output them to the A/D converting unit 13 as voltage waveform signals. The voltage waveform signal is the A/D input shown in FIG. 3.

In the A/D converting unit 13, the voltage waveform signals outputted from the OP-amp 12 are successively converted into the digital data at the sampling rate (50 MHz) on the basis of clock signal outputted from the EXOR circuit 146 of the adding unit 14 to successively output the digital data to the adding unit 14.

In the adding unit 14, the digital data which are a successively outputted from the A/D converting unit 13 during one measurement period T, are integrated. As a result of the adding process (integrating process) shown in FIG. 3, the integrated data is outputted to the operating unit 15 after the first measurement was finished. In the operating unit 15, during the second measurement period, the filter process of the integrated data outputted from the adding unit 14 (for example, to obtain the moving average of the integrated data) and a logarithmic transformation thereof are carried out. The processed data are outputted to the displaying unit 16 as display data.

When the display data obtained by carrying out the logarithmic transformation of the integrated data are received by the displaying unit 16 after the second measurement, the waveform of the backward scattering light received by the APD 11 or that of the Fresnel reflection light received by the APD 11 are displayed on the display of the displaying unit 16 on the basis of the display data during the third measurement period.

In the optical pulse measuring operations, the operation of the A/D converting unit 13 shown in FIG. 2 will be explained in detail with reference to the timing chart shown in FIG. 4.

FIG. 4 shows the optical pulse 2 which is generated by the optical generator 1, the measured voltage waveform signal (A/D input signal) which is inputted into the A/D converting unit 13, the clock signal (clock signal of A/D converter 131) which is inputted into the A/D converter 131 and the clock signal (clock signal of A/D converter 132) which is inputted into the A/D converter 132.

In FIG. 4, the operation of the A/D converting unit 13, which is carried out when the optical pulses 2 are generated during each measurement period is shown in detail. In the first measurement period including the period T1 shown in FIG. 4, the clock signal inputted into the A/D converter 131 from the adding unit 14 is the same as the reference clock signal generated by the adding unit 14. On the other hand, the clock signal inputted into the A/D converter 132 from the adding unit 14 is an inverted clock signal because the clock signal is inputted into the A/D converter 132 through the inverter 134.

In the second measurement period including the period T2 shown in FIG. 4, the clock signal to be inputted into the A/D converter 131 from the adding unit 14 is generated by inverting the clock signal inputted into the A/D converter 131 during the first measurement. The clock signal inputted into the A/D converter 132 from the adding unit 14 is the same as the reference clock signal because the clock signal is inputted into the A/D converter 132 through the inverter 134.

The reason why each clock signal is inputted into the A/D converters 131 and 132 as described above is that the LSB signal inputted into the EXOR 146 from the adding counter 145 is effective during the second measurement period. The operation of the A/D converting unit 13 and that of the adding unit 14 will be explained with reference to the timing chart shown in FIG. 5, in which the portion of the period T1 and that of the period T2 are enlarged.

FIG. 5 shows the voltage waveform signal (input analog signal) which is inputted into the A/D converting unit 13, the LSB signal (LSB of adding counter) which is outputted from the adding counter 145 of the adding counter 14, the clock signal (clock signal of A/D converter 131) which is inputted into the A/D converter 131, the inverted clock signal (clock signal of A/D converter 132) which is inputted into the A/D converter 132, the digital data (output data of A/D converter 131) which is outputted from the A/D converter 131, the digital data (output data of A/D converter 132) which is outputted from the A/D converter 132, the digital data (input data of adder) which is inputted into the adding unit 14, the R/W (read/write) signal for the memory 144 of the adding unit 14 (R/W signal for memory), the data (output data of memory) which is read-out from the memory 144 of the adding unit 14 and the integrated data (output data of adder) which is outputted from the adder 141 of the adding unit 14.

During the period T1 shown in FIG. 5, the voltage waveform signal inputted into the A/D converting unit 13 is inputted into the A/D converters 131 and 132 simultaneously. Because the LSB signal outputted from the adding counter 145 is ineffective (that is, "Low" level) during the period T1, the clock signal inputted into the A/D converter 131 from the EXOR 146 of the adding unit 14 is synchronized with the reference clock signal generated by the clock generator 142 of the adding unit 14. That is, the clock signal inputted into the A/D converter 131 is the same as the reference clock signal. The sampling of the inputted voltage waveform signal is carried out by the rise of the clock signal to convert the sampling data into the digital data. The digital data is outputted to the adder 141 of the adding unit 14 through the switch 133 by the fall of the clock signal.

When the digital data is outputted from the A/D converter 131, the output side of the A/D converter 131 is selected by the switch 133 because the signal inputted into the switch 133 from the EXOR 146 is an ON level. As shown in FIG. 5, the digital data of the A/D converter 131, which is selected during a latch time that the clock signal is the ON level, is outputted to the adder 141 of the adding unit 14.

During the period T1 shown in FIG. 5, because the inverted clock signal caused by the inverter 134 is inputted into the A/D converter 132, the sampling of the inputted voltage waveform signal is carried out by the rise of the clock pulse next to the clock pulse which is used for the sampling carried out by the A/D converter 131 in order to convert the sampling data into the digital data. The digital data is outputted to the adder 141 of the adding unit 14 through the switch 133 by the fall of the clock pulse.

When the digital data is outputted from the A/D converter 132, the output side of the A/D converter 132 is selected by latching the OFF level of the clock signal to the integrated buffer of the switch 133 because the clock signal inputted into the switch 133 from the EXOR 146 is an OFF level. As shown in FIG. 5, the digital data of the A/D converter 132, which is selected while the clock signal is the OFF level, is outputted to the adder 141 of the adding unit 14.

During the period T1 shown in FIG. 5, the digital data which is alternately inputted into the adder 141 of the adding unit 14 through the switch 133 from the A/D converters 131 and 132, is successively written in the memory 144 at the write-in timing of the write-in signal W outputted from the adder 141 to the memory 144 as shown in FIG. 5.

Next, during the period T2 shown in FIG. 5, the voltage waveform signal inputted into the A/D converting unit 13 is inputted into the A/D converters 131 and 132 simultaneously. Because the LSB signal outputted from the adding counter 145 is effective (that is, "Hi" level) during the period T2, the clock signal inputted into the A/D converter 132 from the EXOR circuit 146 of the adding unit 14 is synchronized with the reference clock signal by further inverting the inverted clock signal with the inverter 134, which is synchronized with the reference clock signal generated by the clock generator 142 of the adding unit 14. That is, the clock signal inputted into the A/D converter 132 is the same as the reference clock signal. The sampling of the inputted voltage waveform signal is carried out by the rise of the clock signal to convert the sampling data into the digital data. The digital data is outputted to the adder 141 of the adding unit 14 through the switch 133 by the fall of the clock signal.

When the digital data is outputted from the A/D converter 132, the output side of the A/D converter 132 is selected by the switch 133 because the signal inputted into the switch 133 from the EXOR 146 is an OFF level. As shown in FIG. 5, the digital data of the A/D converter 132, which is selected during a latch time that the clock signal is the ON level, is outputted to the adder 141 of the adding unit 14.

During the period T2 shown in FIG. 5, because the inverted clock signal caused by the inverter 134 is inputted into the A/D converter 131, the sampling of the inputted voltage waveform signal is carried out by the rise of the clock pulse next to the clock pulse which is used for the sampling carried out by the A/D converter 132 in order to convert the sampling data into the digital data. The digital data is outputted to the adder 141 of the adding unit 14 through the switch 133 by the fall of the clock pulse.

When the digital data is outputted from the A/D converter 131, the output side of the A/D converter 131 is selected by the switch 133 because the inverted clock signal inputted into the switch 133 from the EXOR 146 is an ON level. As shown in FIG. 5, the digital data of the A/D converter 131, which is selected while the clock signal is the ON level, is outputted to the adder 141 of the adding unit 14.

During the period T2 shown in FIG. 5, the digital data which is alternately inputted into the adder 141 of the adding unit 14 through the switch 133 from the A/D converters 131 and 132, is successively written in the memory 144 at the write-in timing of the write-in signal W outputted from the adder 141 to the memory 144 as shown in FIG. 5.

As described above, during the first measurement period including the period T1 shown in FIG. 5, first, the A/D converter 131 is selected to output the digital data therefrom. Next, the A/D converter 132 is selected to output the digital data therefrom. As a result, each digital data is alternately outputted to the adding unit 14 in the order of the A/D converter 131 and the A/D converter 132.

During the second measurement period including the period T2 shown in FIG. 5, first, the A/D converter 132 is selected to output the digital data therefrom. Next, the A/D converter 131 is selected to output the digital data therefrom. As a result, each digital data is alternately outputted to the adding unit 14 in the order of the A/D converter 132 and the A/D converter 131.

Figure 9A:
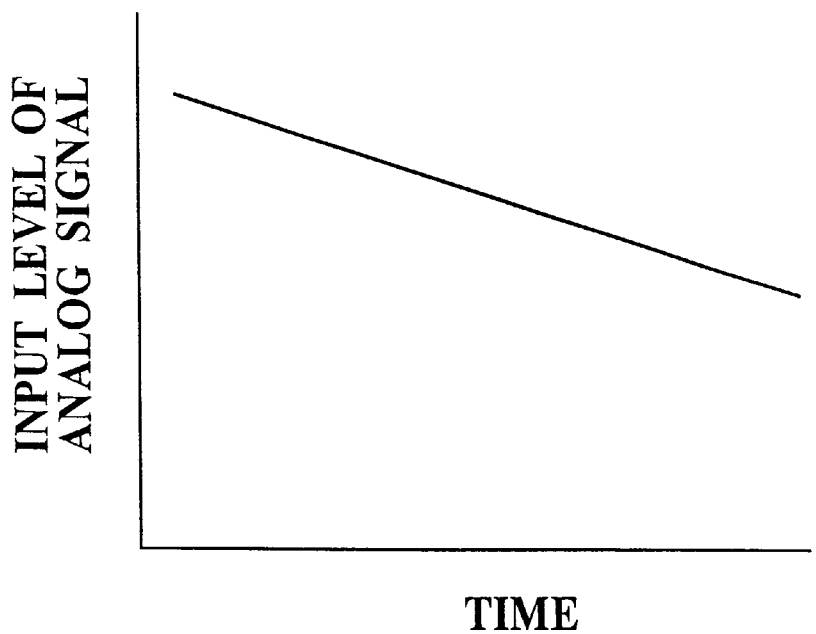
FIG. 9A is a view showing an example of an analog voltage signal to be inputted into the A/D converters shown in FIG. 8.
Figure 9B:
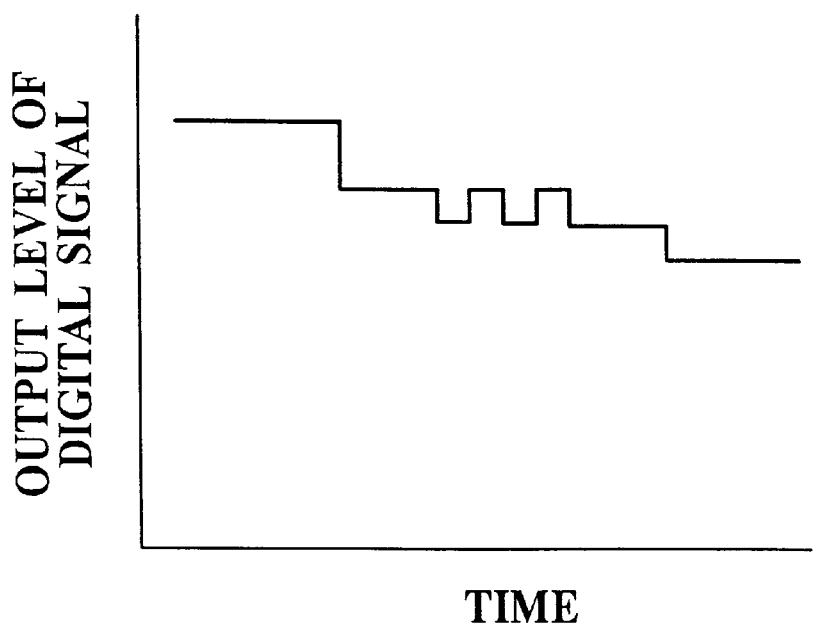
FIG. 9B is a view showing a digital signal to be outputted from the A/D converters when the analog voltage signal shown in FIG. 9A is inputted into the A/D converters.

According to the earlier development, when the digital data of the A/D converter 21 and that of the A/D converter 22 are alternately outputted to the CPU circuit 24, as shown in FIGS. 9A and 9B, the dispersion between the two output level of the digital signals is caused by each output characteristic of the A/D converters 21 and 22 even though the input level of the voltage waveform signal inputted into the A/D converter 21 is the same as that of the A/D converter 22. As a result, there is some possibility that the linearity of the converted data deteriorates.

On the other hand, according to the present embodiment, because the output order of the digital data outputted from the two A/D converters 131 and 132 is changed by the A/D converting unit 13 and the adding unit 14 in each measurement period, it is possible to prevent the dispersion between two output digital data from being caused.

That is, as a parameter for operating the A/D converting unit 13, it is assumed that each sampling rate of the A/D converters 131 and 132 is 50 Mbps (Megabit per second). In case that the two A/D converters 131 and 132 carry out the sampling at 50 Mbps, during the first measurement period, each sampling time of the A/D converters 131 and 132 is A/D converter 131: $t=t_0+(2n)\times 20$[ns] and
A/D converter 132: $t=t_0+(2n+1)\times 20$[ns], where $t_0$ is a reference time, and n is an integer which is not less than 0 (n=0, 1, 2, 3, . . . ).

During the second measurement period, each sampling time of the A/D converters 131 and 132 is A/D converter 131: $t=t_0+(2n+1)\times 20$[ns] and
A/D converter 132: $t=t_0+(2n)\times 20$[ns].

In the optical pulse testing apparatus 100 according to the present invention, because the sampling timing of the A/D converter 131 and that of the A/D converter 132 are alternated every measurement period for measuring the optical pulses repeatedly, quantization errors to be caused by an irregularity of each gain of the A/D converters 131 and 132 and that of linearity of the converted digital signal are not caused. As a result, the noise having a repeated pattern, which is caused at the sampling timing of each A/D converter can be removed.

Figure 6A:
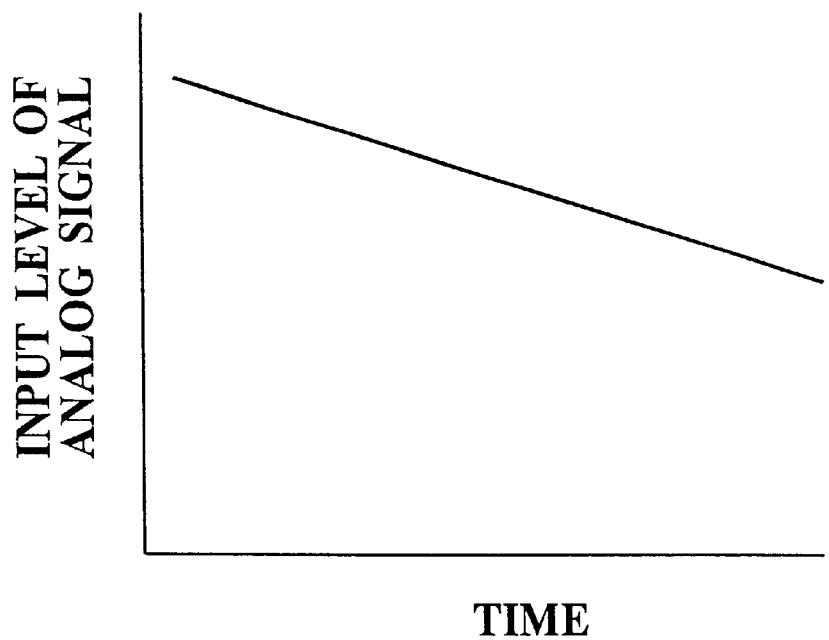
FIG. 6A is a view showing an example of an analog voltage signal to be inputted into the A/D converting unit shown in FIG. 2.
Figure 6B:
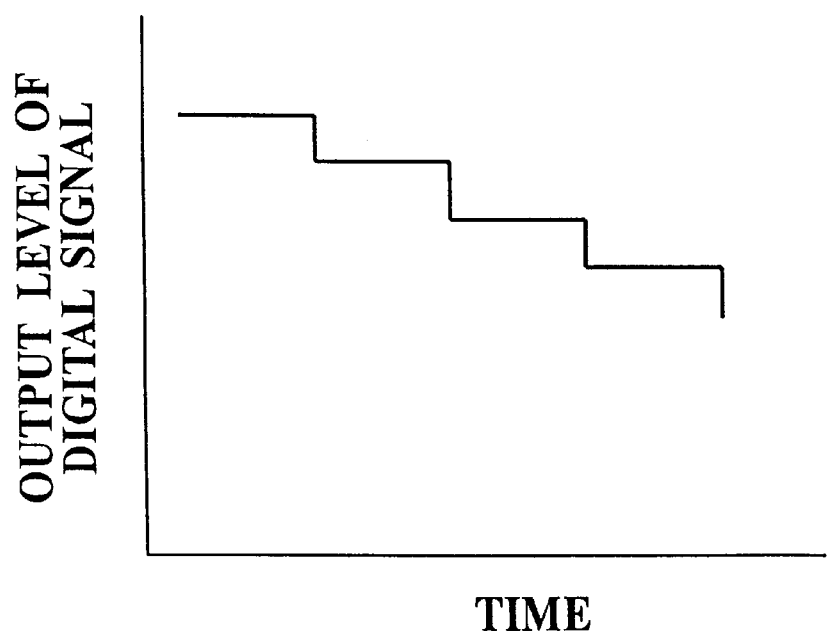
FIG. 6B is a view showing a digital signal to be outputted from the A/D converting unit when the analog voltage signal shown in FIG. 6A is inputted into the A/D converting unit.
Figure 7A:
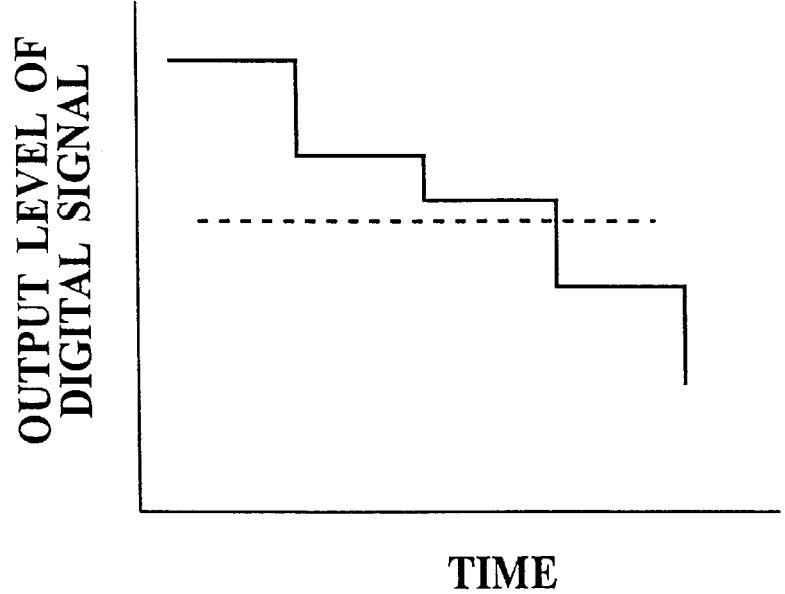
FIG. 7A is a view showing an example of an output characteristic of the A/D converter 21 connected in parallel with the A/D converter 22.
Figure 7B:
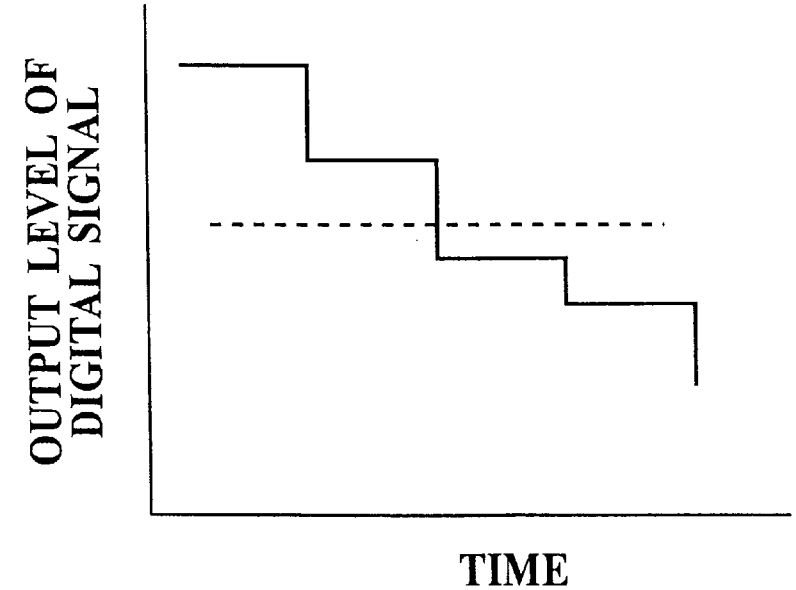
FIG. 7B is a view showing an example of an output characteristic of the A/D converter 22 connected in parallel with the A/D converter 21.
Figure 8:
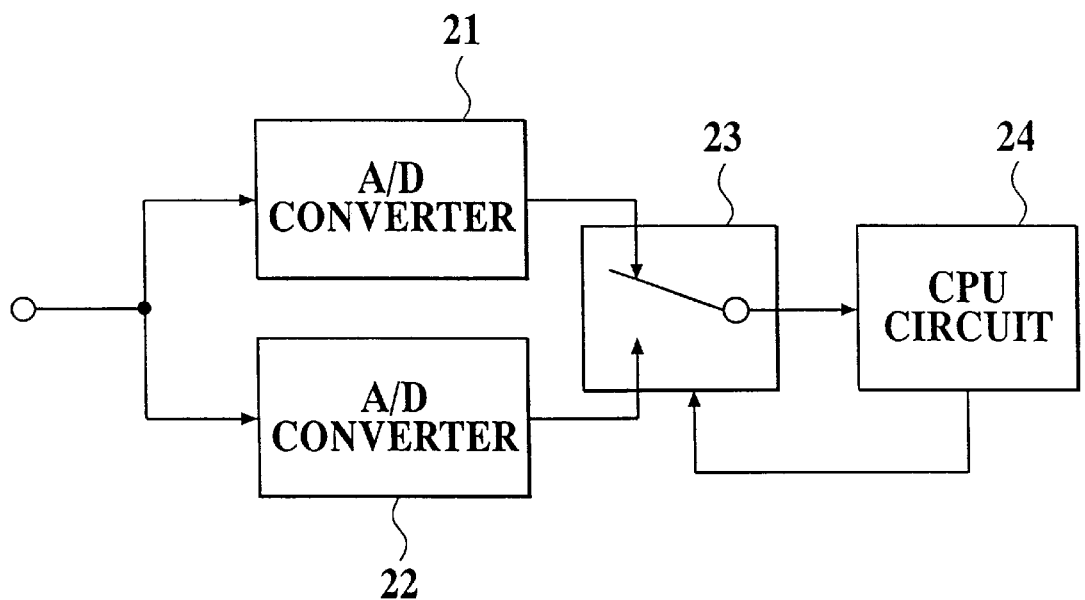
FIG. 8 is a view showing a circuit construction of the A/D converts connected in parallel with each other and the signal processing part in the optical pulse testing apparatus according to an earlier development.

When the analog signal of which the input level decreases with the lapse of time as shown in FIG. 6A is inputted into the A/D converting unit 13, the dispersion of the output level of the digital data outputted from the A/D converting unit 13 is not caused as shown in FIG. 6B. As a result, it is possible to prevent the quantization errors from being caused. When the digital data outputted from a plurality of A/D converters are synthesized, the measuring result having fewer errors can be obtained according to the central limit theorem, as compared with the case in which one A/D converter is used. That is, as compared with the case in which one A/D converter is used, the performance for reducing errors can be improved by using a plurality of the same A/D converters.

As a result, in the optical pulse testing apparatus 100, when the digital data outputted from a plurality of A/D converters are synthesized, the measuring result having fewer errors can be obtained according to the central limit theorem, as compared with the case in which one A/D converter is used. The precise measuring result for the optical pulse signal can be obtained. The performance for reducing errors can be improved during the A/D conversion. The measuring accuracy of the optical pulse signal can be increased.

Although two A/D converters are used in the A/D converting unit 13 in the above embodiment, the present invention is not limited to this. In case that two or more A/D converters are used, when one sampling timing of the A/D converters is alternated with another every measurement period, the dispersion of each digital data of the A/D converters can not be caused. It is possible to cause few quantization errors in the measurement.

Although it is explained that the present invention is applied to the optical pulse testing apparatus 100 as an apparatus for obtaining the measuring result by synthesizing (integrating) the digital data outputted from a plurality of A/D converters in the above embodiment, the present invention is not limited to this. The present invention can be applied to other signal measuring apparatus for obtaining the measuring result by synthesizing the digital data outputted from a plurality of A/D converters in the signal measurement.

When digital data is obtained at one sampling point, digital data outputs of a plurality of A/D converters are synthesized. In case that the digital data outputted from a plurality of A/D converters are synthesized, the digital data output having fewer errors can be obtained according to the central limit theorem, as compared with the case in which one A/D converter is used.

In case that the digital data outputted from a plurality of A/D converters at each sampling point of the time series cyclic signal are synthesized, the cyclic noise having a repeated pattern, which is caused at the sampling timing of each A/D converter by assigning each A/D converter to each sampling point of the time series cyclic signal, can be removed.

The entire disclosure of Japanese Patent Application No. Tokugan-hei 10-273694 filed on Sep. 28, 1998 including specification, claims drawings and summary are incorporated herein by reference in its entirety.

What is claimed is:

1. An A/D converting device comprising:
    a plurality of A/D converters connected in parallel with each other, for converting an analog signal in to digital data;
    a selecting circuit for selecting a particular A/D converter from the plurality of A/D converters at each sampling timing during the converting operation to sample the converted digital data;
    a selecting circuit controlling unit for controlling the selecting circuit so that when one A/D converter is selected at one sampling timing during the Nth converting operation, another A/D converter is selected at the one sampling timing during the (N+1)th converting operation;
    an adding circuit for integrating the digital data sampled at the one sampling timing during each converting operation; and
    a processing unit for processing unit for processing the integrated digital data.

2. The A/D converting device of claim 1 wherein there are two A/D converters.

3. The A/D converting device as claimed in claim 2, wherein the selecting circuit controlling unit counts the number of times that the converting operation is carried out, and outputs a lowest significant bit of the counted number of times to the selecting circuit; and
    the selecting circuit selects one of two A/D converters in accordance with the lowest significant bit.

4. The A/D converting device as claimed in claim 1, wherein the analog signal is an analog cyclic signal.

5. An A/D converting method comprising;
    carrying out converting operations, in which an analog signal is converted into digital data by a plurality of A/D converters connected in parallel with each other;
    selecting a particular A/D converter from the plurality of A/D converters at each sampling timing during the converting operation to sample the converted digital data;
    selecting one A/D converter at one sampling timing during the Nth converting operation when another A/D converter is selected at the one sampling timing during the (N−1)th converting operation;
    integrating the digital data sampled at the one sampling timing during each converting operation; and
    processing the integrated digital data.

6. The A/D converting method of claim 5 wherein there are two A/D converters.

7. The A/D converting method as claimed in claim 6, further comprising counting the number of time that the converting operation is carried out,
    wherein,
    in selecting one A/D converter at one sampling timing, a lower significant bit of the counted number of times is outputted and one of two A/D converters is selected in accordance with the lowest significant bit.

8. The A/D converting method as claimed in claim 5, wherein the analog signal is an analog cyclic signal.

9. An optical pulse testing apparatus comprising:
    a plurality of A/D converters connected in parallel with each other, for carrying out converting operations, in which an optical pulse is converted into a digital data;
    a selecting circuit for selecting a particular A/D converter from the plurality of A/D converters at each sampling timing during the converting operation to sample the converted digital data;
    a selecting circuit controlling unit for controlling the selecting circuit so that when one A/D converter is selected at one sampling timing during the Nth converting operation, another A/D converter is selected at the one sampling timing during the (N+1)th converting operation;
    an adding circuit for integrating the digital data sampled at the one sampling timing during each converting operation; and
    a processing unit for processing the integrated digital data.

10. The optical pulse testing apparatus of claim 9, wherein there are two A/D converters.

11. The optical pulse testing apparatus of claim 10, wherein the selecting circuit controlling unit counts the number of times that the converting operation is carried out, and outputs a lowest significant bit of the counted number of times to the selecting circuit, and
    the selecting circuit selects one of the two A/D converters in accordance with the lowest significant bit.

12. The optical pulse testing apparatus as claimed in claim 9, wherein the optical pulse is an analog cyclic signal.

* * * * *